United States Patent [19]
Horie et al.

[11] Patent Number: 5,950,646
[45] Date of Patent: Sep. 14, 1999

[54] VAPOR FEED SUPPLY SYSTEM

[75] Inventors: Kuniaki Horie, Yamato; Hidenao Suzuki, Fujisawa; Tsutomu Nakada, Yokohama; Takeshi Murakami, Tokyo; Yukio Fukunaga, Yokohama; Masahito Abe, Fujisawa; Hiroyuki Shinozaki, Fujisawa; Kiwamu Tsukamoto, Fujisawa; Mitsunao Shibasaki, Ebina; Yuji Araki; Hiroyuki Ueyama, both of Fujisawa, all of Japan

[73] Assignee: Ebara Corporation, Tokyo, Japan

[21] Appl. No.: 09/003,947

[22] Filed: Jan. 8, 1998

[30] Foreign Application Priority Data

Jan. 8, 1997 [JP] Japan .................................... 9-029875
Jul. 22, 1997 [JP] Japan .................................... 9-211340

[51] Int. Cl.[6] .................................................. B08B 3/10
[52] U.S. Cl. .......................... 134/105; 134/108; 134/902; 134/102.1
[58] Field of Search ............................ 134/166 R, 169 R, 134/166 C, 169 C, 104.1, 105, 902, 108, 107, 100.1, 102.1

[56] References Cited

U.S. PATENT DOCUMENTS

| 4,380,308 | 4/1983 | Greenwood | 134/104.1 |
|---|---|---|---|
| 4,573,586 | 3/1986 | Weiss | 134/104.1 |
| 4,971,087 | 11/1990 | Benedetti et al. | 134/169 R |
| 5,362,328 | 11/1994 | Gardiner et al. | |
| 5,368,651 | 11/1994 | Esser | 134/166 R |
| 5,431,180 | 7/1995 | Stenberg | 134/166 R |
| 5,522,412 | 6/1996 | Ohba et al. | 134/104.4 |
| 5,558,841 | 9/1996 | Nakagawa et al. | 134/104.1 |

FOREIGN PATENT DOCUMENTS

| 5-214570 | 8/1993 | Japan | 134/104.1 |
|---|---|---|---|
| 07268634A | 10/1995 | Japan | |

OTHER PUBLICATIONS

European Patent Office 418,592 Mar. 1991.
New U.S. Patent Application filed Jan. 8, 1998, entitled "Vapor–Phase Film Growth Apparatus and Gas Ejection Head", by Kuniaki Horie et al., Atty. Docket No. 1213/GEB610US.

*Primary Examiner*—Frankie L. Stinson
*Attorney, Agent, or Firm*—Wenderoth, Lind & Ponack, LLP

[57] ABSTRACT

A vapor feed supply system including a vaporizer device and a method of cleaning a vapor flow region employing such a vaporizer device enables thorough cleaning of the system, without having to degrade the overall system vacuum in the process of cleaning the vaporizer device. The method includes defining a cleaning fluid passage having a predetermined withstand pressure by isolating a cleaning region of the vapor flow region, and flowing a cleaning fluid into the cleaning fluid passage under a pressure so as to enable the cleaning fluid to remain in a liquid state at a cleaning temperature of the cleaning region.

31 Claims, 11 Drawing Sheets

VAPOR FEED SUPPLY SYSTEM

BACKGROUND OF THE INVENTION

1. Field of the Invention

The present invention relates to a vapor feed supply system for supplying a vapor feed for producing thin film devices of a highly dielectric or ferroelectric material, such as barium or strontium titanate, in a chemical vapor deposition apparatus.

2. Description of the Related Art

In recent years, there has been a quantum jump in circuit density of integrated circuit devices produced by the semiconductor industries, and intense development activities are under way in anticipation of giga-bit order DRAMs replacing the prevailing mega-bit order DRAMs of today. Dielectric thin film materials used to make high capacitance devices necessary for producing DRAMs have, in the past, included silicon oxide or silicon nitride films of dielectric constants less than ten, tantalum pentaoxide ($Ta_2O_5$) films of dielectric constants less than twenty; however, newer materials such as barium titanate ($BaTiO_3$) or strontium titanate ($SrTiO_3$) or mixtures of these compounds, having dielectric constants of about three hundred, appear to be more promising. Promising also are even higher dielectric materials such as lead-zinc-titanate (PZT), lead-lithium-zinc-titanate (PLZT) and Y1.

Of the various methods of making such thin films, prospects are particularly bright for the chemical vapor deposition (CVD) process, and in this case, it is necessary that a vapor feed must ultimately be supplied in a steady gas stream to a substrate disposed in a film deposition chamber. The vapor feed is produced by heating a liquid mixture, produced by liquefying such materials as $Ba(DPM)_2$ or $Sr(DPM)_2$ which is solid at normal temperature, and adding some organic solvent (for example, Tetrahydrofuran (THF)) for stabilizing the vaporization characteristics.

When producing a vapor feed from a liquid feed material in such vaporizer devices, some metallic compound, for example, $SrCO_3$, or organic feed material may decompose inside the vaporizer to form intermediate products, which can precipitate within the vaporizer device, or some unvaporized residual components remain in the vaporizer device in a solid or liquid form. Such precipitation and residual matters are apt to cause blocking in the vapor passages and can lead to deterioration in the device quality because of compositional fluctuations in the feed material.

To avoid such production problems, it is customary to wash the inside of the vaporizer device, as necessary or periodically, and such cleaning operations have conventionally been carried out by running a solvent (cleaning solution) inside the vaporizer device.

Difficulties are encountered in such a manner of cleaning, however, because the interior of the vaporizer device is usually held at a high temperature and a low pressure, causing the liquid solvent to vaporize within the vaporizer device and lessening its ability to dissolve and wash away the adhering precipitates thus resulting in inadequate cleaning. If the interior pressure of the vaporizer device is raised in an attempt to counter such effect, the system vacuum including the film deposition chamber is degraded, and the restarting procedure is made more time consuming.

There are other problems associated with the basic design of the existing vaporizer devices. For example, in addition to a feed supply path to supply a feed vapor to the deposition chamber, a bypass path is necessary to reroute the feed vapor away from the deposition chamber, when it is not in use or until the vapor delivery conditions are stabilized so that the component materials in the vapor feed can be trapped and processed suitably for recovery or released into the atmosphere.

To clean such a system, trapping devices are usually decoupled from the system, and treated in a separate location. It is obvious that such a procedure is not only cumbersome but also very inefficient. This is because when the volume of the gas flowing through the bypass path to be trapped and processed is large, the traps must be exchanged quite frequently or else the size of the trap device must be increased to accommodate the large gas volume.

Figure 13:
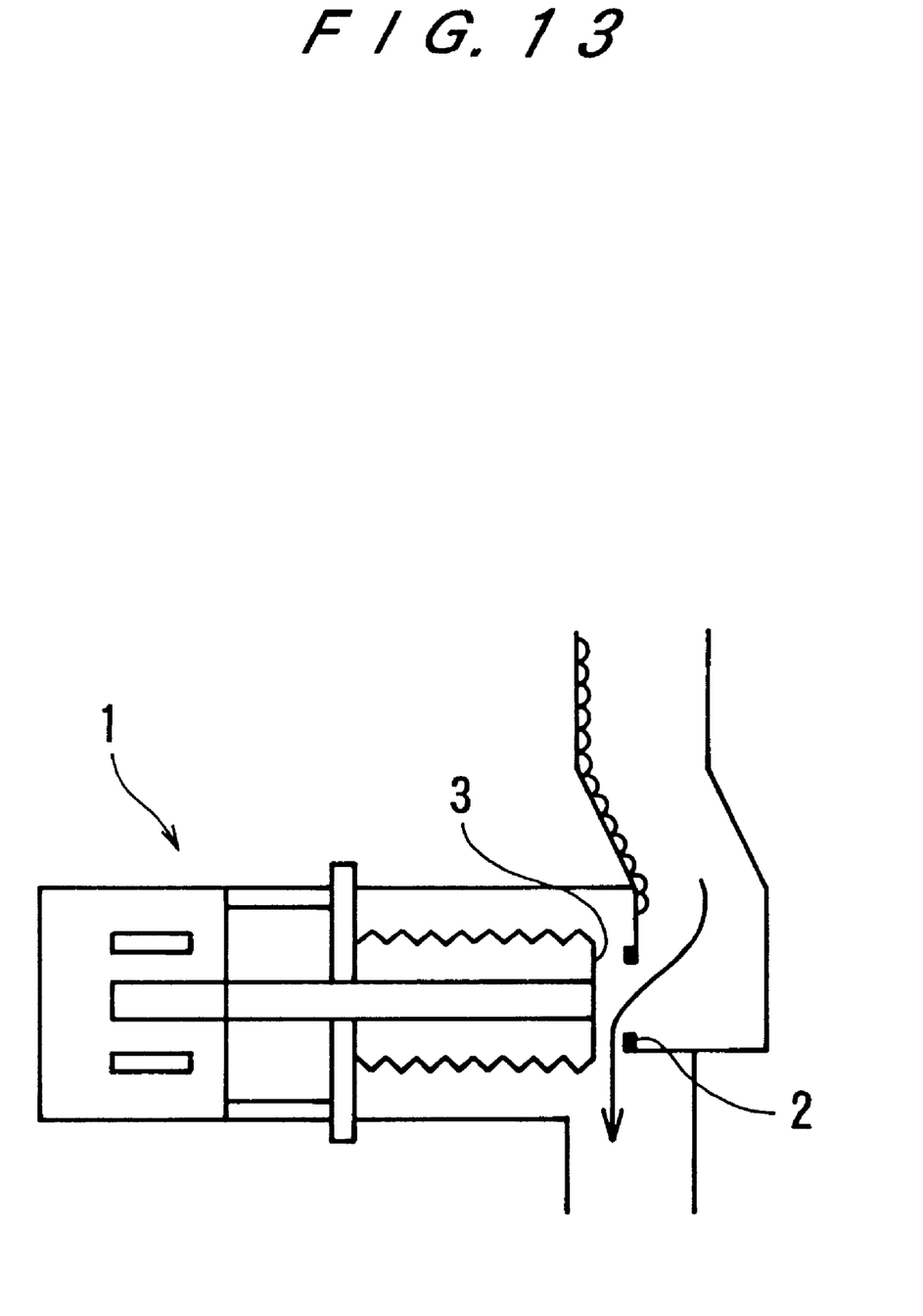
FIG. 13 is a cross sectional view of a conventional two-way valve.

Furthermore, to prevent the vaporized vapor feed from entering into the bypass path during the film deposition process, many valves, such as electromagnetic valves, are generally provided in the vicinity of the entrance to the bypass piping. However, because these gases are difficult to vaporize stably, unvaporized or degraded materials often run into the output side of the vaporizer device. When such extraneous materials are allowed into the output side of the vaporizer device, liquid material leaking into the interior of a two-way valve 1, as shown in FIG. 13 for example, can stick to a valve seat 2 and valve element 3 to cause sealing problems or damage the surface integrity of the mating surfaces of the valve.

SUMMARY OF THE INVENTION

It is a first object of the present invention to provide a vapor feed supply system including a vaporizer device and a method of cleaning a vapor flow region including such a vaporizer device, to enable thorough cleaning of the system, without having to degrade the overall system vacuum in the process of cleaning the vaporizer device.

The first object has been achieved in a method for cleaning a vapor flow region for flowing a vapor feed, the vapor feed having a susceptibility to precipitating component substances, the method comprising: defining a cleaning fluid passage having a predetermined withstand pressure by isolating a cleaning region of the vapor flow region; and flowing a cleaning fluid into the cleaning fluid passage under a pressure so as to enable the cleaning fluid to remain in a liquid state at a cleaning temperature of the cleaning region.

Accordingly, the cleaning fluid is introduced into the cleaning region in a liquid state so that a maximum performance can be obtained from a cleaning fluid by allowing the liquid to thoroughly dissolve adhering matters quickly.

The operative temperature for cleaning may be substantially equal to the specific temperature for converting the liquid feed to a vapor. Accordingly, the temperature of the cleaning region does not drop after carrying out the cleaning process, and the system can be restarted quickly.

Prior to cleaning, the cleaning region may be subjected to a temperature lower than the specific temperature for converting the liquid feed to a vapor. The higher the temperature, the higher the pressure required to keep the cleaning fluid in a liquid state, so that the vaporizer vessel itself has to be made pressure resistant. In such a case, the operative temperature for cleaning should be somewhat lower than the operative temperature for vapor generation to minimize the level of pressurization.

The cleaning fluid may be pre-heated prior to delivery into the cleaning region. By so doing, if the temperature of the cleaning fluid is raised to the cleaning temperature, for example, a temperature drop due to a loss of heat to the cleaning region can be prevented so that the system can be restarted quickly. Quick processing can also be achieved by flowing the cleaning fluid into the cleaning region while it is kept at a negative pressure so that, first, the cleaning fluid is introduced into the vaporizer device to completely fill the cleaning region and then is circulated through the cleaning region.

The object has also been achieved through a method for cleaning a vapor flow region for flowing a vapor feed having a susceptibility to precipitating component substances, the method comprising: defining a cleaning fluid passage having a predetermined withstand pressure by isolating a cleaning region of the vapor flow region; and flowing a cleaning fluid into the cleaning fluid passage under a pressure so as to enable the cleaning fluid to be introduced into the cleaning region while undergoing partial boiling at a cleaning temperature.

Accordingly, the cleaning fluid is introduced in a liquid state into the vaporizer device so that the maximum cleaning performance can be achieved through a stirring effect of the boiling fluid to dissolve or dislodge adhering matters from the inside surfaces of the vaporizer device.

Another aspect of the invention is a vaporizer apparatus comprising: a vaporizer device for vaporizing a vapor feed from a liquid feed supplied through a liquid feed passage under a specific pressure and a specific temperature and delivering the vapor feed to a vapor feed passage; a cleaning fluid supply device for delivering a cleaning fluid to a cleaning region, including at least a portion of the vaporizer device; and a pressurizer for pressurizing the cleaning fluid flowing into the cleaning region.

The pressurizer may include a pumping device, pressured gas supplying device, and a check valve provided at an end of the cleaning region. The cleaning fluid supply device may include a cleaning fluid passage to merge with the vapor feed passage and to branch off from the vapor feed passage; and a pressurizer for pressurizing the cleaning fluid to a pressure not lower than a vaporization pressure. It is also permissible that the cleaning fluid passage is provided with a heating device for heating the cleaning fluid, and conversely, the vaporizer apparatus may be provided with a cooling device for cooling the cleaning fluid.

The vaporizer device may be provided with a thermal medium passage for flowing a thermal medium to enable switching between heating and cooling. By such an arrangement, the vaporizer device may be thermally controlled with a simple setup to carry out vapor generation or a cleaning process. By using a common thermal medium for heating and cooling, switching between the two can be carried out without a need for cleaning the vaporizer device.

A second object of the invention is to enable the trapping apparatus used in the vapor feed supply system to be thoroughly cleaned quickly, without having to remove the trapping apparatus from the system, and that valve devices can assure hermetic isolation of the vapor feed passage from the deposition chamber.

The second object has been achieved by using a trapping system comprising: a trap device for trapping components in a gaseous fluid flowing in a gaseous fluid passage; a cleaning fluid passage for delivering and circulating a cleaning fluid to the interior of the trap device so as to dissolve adhering matters sticking to internal surfaces of the trap device; and a valve device for selectively switching between the gaseous fluid passage and the cleaning fluid passage.

Accordingly, the operational efficiency of the trapping apparatus can be improved by delivering the cleaning fluid into the interior of the vaporizer device so as to enable dissolving adhered component substances precipitated from the vapor feed. By selecting a solvent which has a high capacity for dissolving the component substances as a cleaning fluid, storage and transport of spent cleaning fluid are facilitated by minimizing the handling volume and storage space, thereby enhancing processing and recycling efficiencies.

The cleaning fluid passage may be provided with a cleaning fluid storage tank for recovering spent fluid containing dissolved adhering matters. In such an arrangement, the component substances in the vapor feed can be recovered together with the cleaning fluid for recycling.

The cleaning fluid passage may be provided with a pressurizer for pressurizing the cleaning fluid to a pressure not lower than a vapor pressure at an operative temperature for cleaning of the trap device. By such an arrangement, the cleaning fluid can be introduced into the trapping apparatus in a liquid state so that the cleaning process can be carried out effectively.

The cleaning fluid passage may be provided with a heater for heating the cleaning fluid. By such an arrangement, the temperature of the cleaning fluid is raised to increase the saturation solubility of the fluid to enhance the cleaning process.

Another aspect of the invention is a trapping system comprising: a vaporizer device for converting a liquid feed into a vapor feed; a deposition chamber; a deposition chamber passage for communicating the vaporizer device and the deposition chamber; a bypass passage branched off from the deposition chamber passage at a position downstream of the vaporizer device and having a trap device; a valve device provided in the bypass passage at a downstream location of the trap device for opening and closing the bypass passage; and a purge gas injection passage communicated to the bypass passage at an upstream location of the trap device for preventing inflow of the vapor feed into the trap device when the valve device is closed.

A third object of the present invention is to present a valve device which enables cleaning of the interior of the valve mechanism even if a fluid, containing unvaporized matters and degraded matters in the vapor feed, is flowed therethrough, to prevent a loss of hermetic integrity of the valve device.

The third object has been achieved in a valve device for use in a feed gas passage for controlling flow of a vapor feed having a susceptibility to precipitating component substances comprising: a purge gas supply port for directing a purge gas to spaces between a valve element and a valve seat; and/or a cleaning fluid supply port for directing a cleaning fluid from a vicinity of the valve element to at least one passage of either an upstream passage or a downstream passage of the feed gas passage.

In such an arrangement of the valve device, solid matters sticking to the valve seat or valve element are first blown off or facilitated to vaporize by the purge gas, or washed by the cleaning fluid, before closing the valve so as to prevent improper sealing or damage to the valve components by such solid matters. Also, by directing cleaning fluid from the vicinity of the valve element to remove solid matters precipitated near the valve elements improper sealing or damage to the valve components are prevented when the valve device is opened next time.

Another aspect of the invention is a method for cleaning a valve device for controlling flow of a vapor feed, the vapor feed having a susceptibility to precipitating component substances, wherein the method includes directing a purge gas and/or a cleaning fluid at spaces between a valve element and a valve seat immediately prior to closing the valve device.

The method may also include supplying a cleaning fluid from a vicinity of the valve element to at least one passage of either an upstream passage or a downstream passage relative to the valve device after closing the valve device. By so doing, solid matters precipitated near the valve element are removed so that improper sealing or damage to the valve components are prevented when the valve device is opened next time.

Another aspect of the invention is a vaporizing apparatus comprising: a vaporizer device for converting a liquid feed supplied through a liquid feed passage into a vapor feed at a vaporizing pressure and a vaporizing temperature and delivering it to a vapor feed passage; a valve device for closing or opening the vapor feed passage; a cleaning fluid storage tank; a cleaning fluid supply port connected to the cleaning fluid storage tank for directing a cleaning fluid from a vicinity of a valve element to flow to an upstream side of the vapor feed passage; and a cleaning fluid venting passage communicating switchably with the cleaning fluid storage tank and the liquid feed passage. Accordingly, a comprehensive cleaning path is established so that the entire system, including the vaporizer and the valve device can be cleaned efficiently by flowing a cleaning fluid within the system.

DESCRIPTION OF THE PREFERRED EMBODIMENTS

Figure 1:
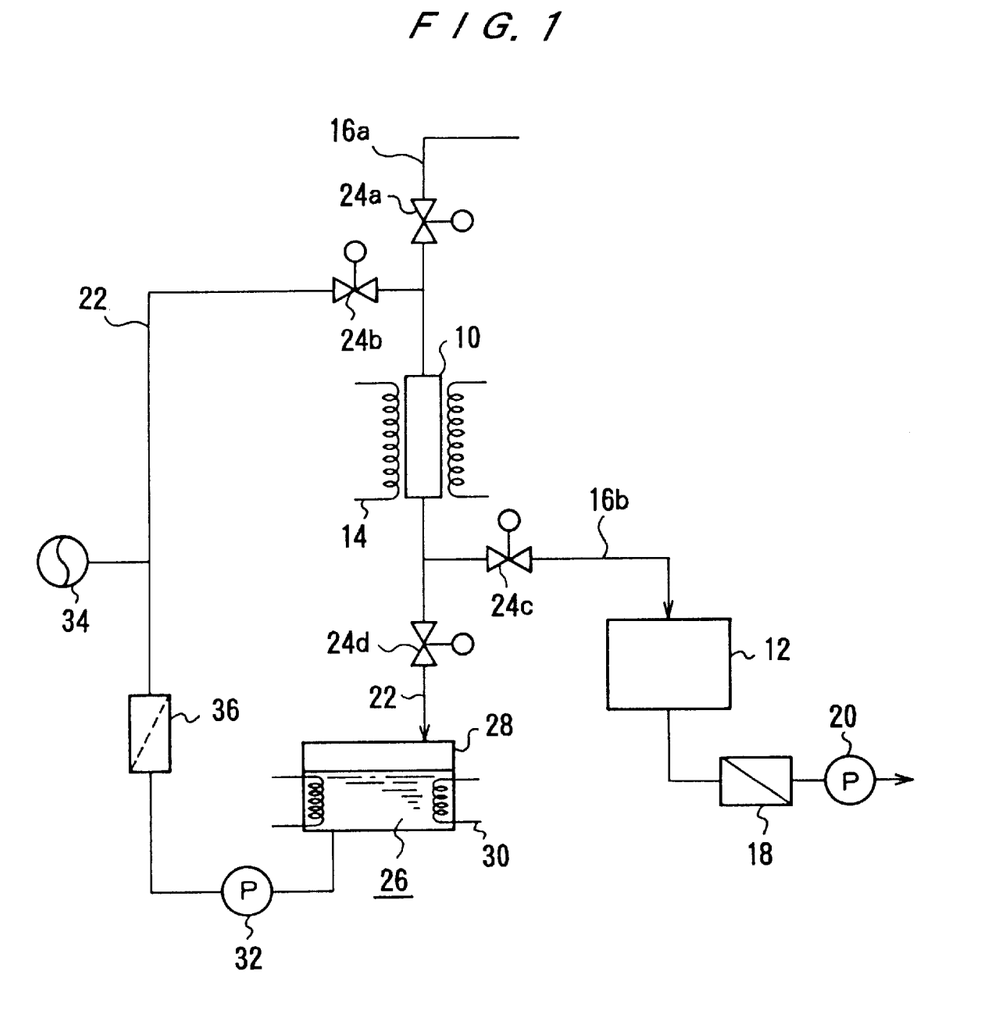
FIG. 1 is a schematic drawing of a first embodiment of the present invention.

In the following, preferred embodiments will be presented with reference to the drawings. FIG. 1 shows a first embodiment of the vapor feed supply system in which a liquid feed material is supplied through a liquid feed passage 16a, and a vaporizer device 10 with a heater 14 vaporizes the liquid feed material by heating it to its vaporization temperature and delivers the resulting vapor feed to a film deposition chamber 12 through a vapor feed passage 16b. In the film deposition chamber 12, the vapor feed and an oxygen-containing gas delivered through a piping (not shown) are directed to a substrate heated to a certain reaction temperature to form a thin metal oxide film thereon. The spent gas produced in the deposition process is passed through a trap device 18 and is exhausted out by an exhaust pump 20.

This vapor feed supply system includes a cleaning fluid passage 22, which merges with the liquid feed passage 16a in an upstream location of the vaporizer device 10 and branches off from the vapor feed passage 16b in a downstream location of the vaporizer device 10, and circulates a cleaning fluid from a cleaning fluid storage tank 28 through a circulation pump 32 and a filter 36. In each of the passages in the upstream side of the merging point of the liquid feed passage 16a and the cleaning fluid passage 22, two-way valves 24a, 24b are provided to operate in an open or shut position, and in each of the passages in the downstream side of the merging point of the liquid feed passage 16a and the cleaning fluid passage 22, similar two-way valves 24c, 24d are provided. The cleaning region thus formed, by the two-way valves, liquid feed passage, a portion of the vapor feed passage and the interior of the vaporizer device, is designed to withstand the pressure exerted during the pressure cleaning process which will be described later.

The cleaning fluid passage 22 includes an accumulator 34 for accommodating a pressurized gas to pressurize the entire cleaning fluid passage. The cleaning fluid storage tank 28 has a heater 30 for heating the cleaning fluid 26 to an operating temperature of the vaporizer device 10, for example, 250° C. By choosing a cleaning fluid 26 to have the same composition as the solvent used in preparing the liquid feed material, any residual cleaning fluid remaining in the vaporizer device 10 would not interfere with the vapor deposition process of making metal oxide thin films.

Next, the operation of the vapor feed supply system of the first embodiment will be discussed. A film deposition process is carried out by closing the two-way valves 24b, 24d in the cleaning fluid passage 22, and opening the two-way valves 24a, 24c in the liquid feed passage 16a and the vapor feed passage 16b.

To clean the vaporizer device 10, the two valves 24a, 24c in the liquid feed passage 16a and the vapor feed passage 16b are closed, and the two valves 24b, 24d in the cleaning fluid passage 22 are opened so that the cleaning fluid path is hermetically isolated. The cleaning fluid is preheated to the operating temperature of the vaporizer device 10, 250° C. for example, by the heater 30, and the accumulator 34 is used to raise the internal pressure to the vapor pressure of the cleaning fluid (THF) at the operating temperature of the vaporizer device 10, for example 41 Kgf/cm$^2$, and circulated through the passage by means of the pump 32.

The cleaning fluid 26, after removing solid matters with a filter 36, flows into the interior of the vaporizer device 10 while maintaining the liquid state even at a temperature of 250° C. because of the applied pressure of more than 41 Kgf/cm$^2$ so that the solid matters adhered to the interior of the vaporizer device 10 are dissolved or otherwise removed in the liquid to clean the vaporizer device 10. The used cleaning fluid 26 is returned from the cleaning fluid passage 22 to the storage tank 28 after going through the vaporizer cleaning step. Effective cleaning of the vaporizer interior is thus achieved by supplying the cleaning fluid while maintaining the liquid state during cleaning thereby.

When the cleaning step is completed, the two valves 24b, 24d in the cleaning fluid passage 22 are closed, and the two valves 24a, 24c in the liquid feed passage 16a and the vapor feed passage 16b are opened so as to resume the film deposition process. In the first embodiment, because the temperature of the cleaning fluid is raised to the operating temperature of the vaporizer device 10, the vaporizer does not cool off during the cleaning process, so that the waiting time required to restart the operation of the film deposition process can be minimized.

It should be noted that the cleaning fluid can be introduced at room temperature into the vaporizer device. The device temperature drops slightly but if the temperature drop is small, reheating time is also short, and little time is lost in practice.

Also, in the process presented above, the accumulator 34 was operated at above a pressure of 41 Kgf/cm$^2$, which is a vaporization temperature of THF, but lower pressures may also be used to allow partial vaporization of the cleaning fluid so long as the cleaning fluid partially remains in a liquid phase. In this case, if the temperature of the cleaning fluid is set at a lower temperature than that of the vaporizer device, the cleaning fluid may boil by contacting the interior wall of the vaporizer so that the vaporizer device will be locally washed by liquid phase cleaning fluid. By continuously flowing the cleaning fluid, the overall wall surface is cleaned, thereby promoting removal of solid matters by descaling, dissolution and blowoff processes that are aided by turbulence and stirring effects.

Figure 2:
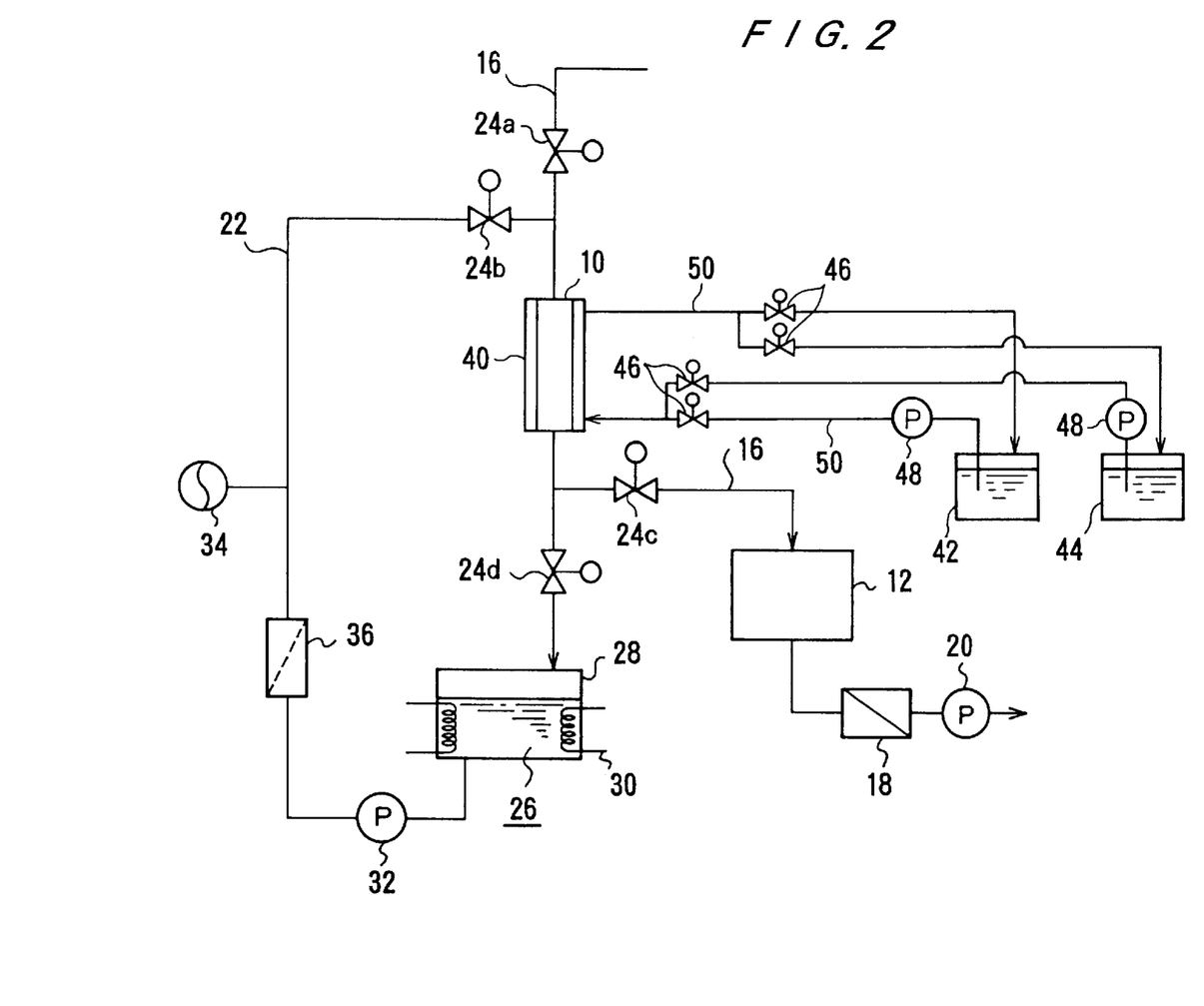
FIG. 2 is a schematic drawing of a second embodiment of the present invention.

FIG. 2 shows a second embodiment which differs from the first embodiment in that, instead of the electric heater, a jacket heater 40 is used to supply heat from outside the vaporizer 10. The jacket heater 40 includes a switching valves 46, a pump 48 and thermal medium piping 50 to enable temperature control by switching between a high temperature source 42 for heating and a low temperature source 44 for cooling.

An example of the cleaning process will be described. During the film deposition process, the jacket heater 40 is supplied with a heating medium heated to a temperature above the vaporization temperature of the liquid feed material. When it is required to carry out the cleaning process (after finishing the vapor forming process), the two-way valves 46 are switched so that the low temperature medium is supplied to the jacket heater 40 to decrease the vaporizer temperature to a suitable intermediate temperature between the vaporization temperature and room temperature so as to lower the internal pressure necessary for cleaning.

The intermediate temperature should be chosen carefully because, if it is too low, restarting the vaporizer device is delayed. For example, suppose the vapor pressure of the cleaning fluid is 41 Kgf/cm$^2$ when the vaporization temperature is 250° C., if the vaporizer temperature is lowered to 200° C., the vapor pressure of the cleaning fluid is 20 Kgf/cm$^2$, and if the vaporizer temperature is lowered to 150° C., the vapor pressure of the cleaning fluid is 8 Kgf/cm$^2$, resulting in a lower internal pressure. The advantage of a lower internal pressure is that the construction of the vaporizer 10 and the accumulator 34 can be simplified.

Figure 3:
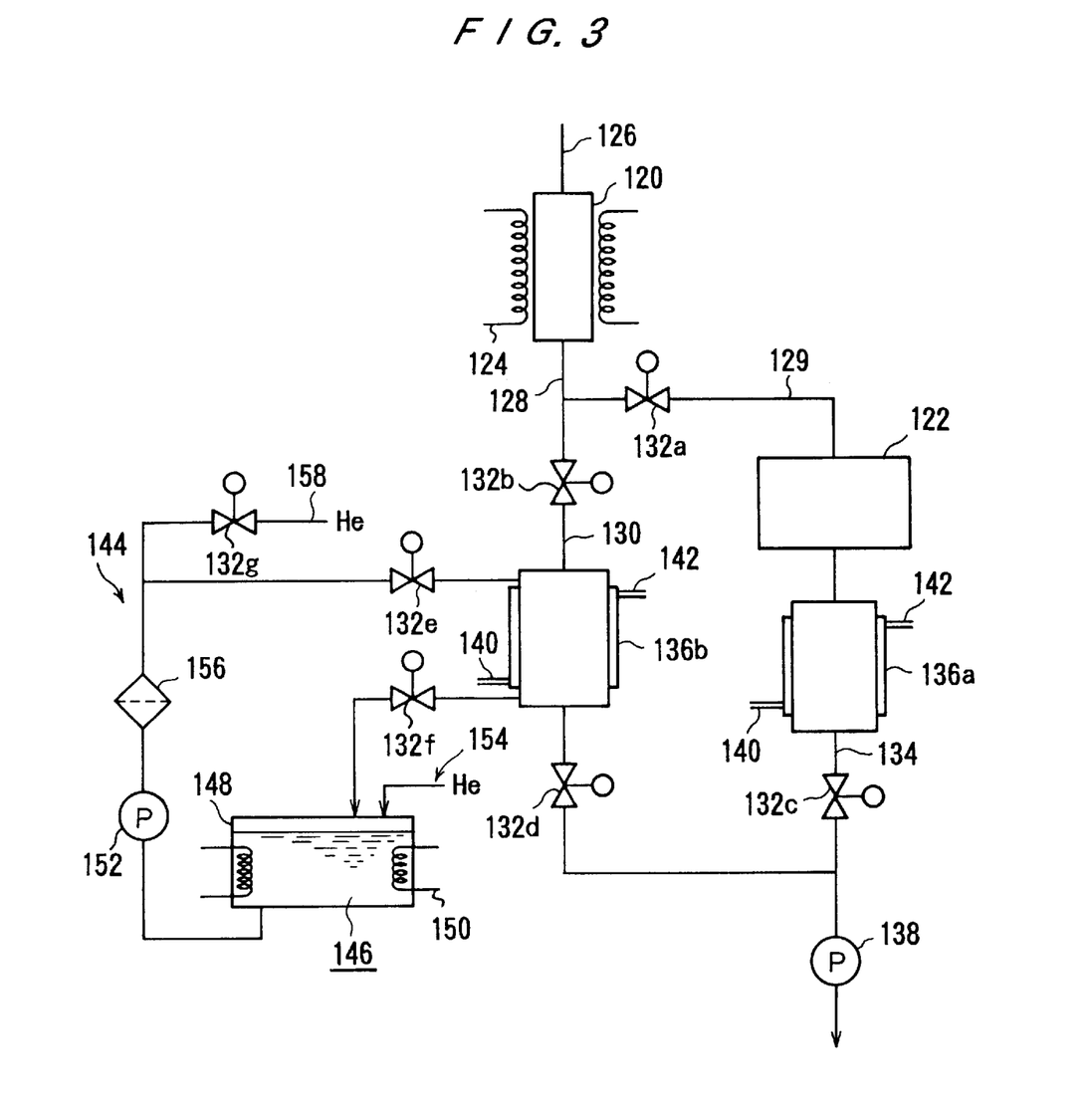
FIG. 3 is a schematic drawing of a third embodiment of the present invention.

FIG. 3 shows a third embodiment of the vapor feed supply system. The system is designed to include a vaporizer device 120 which produces a vapor from a liquid feed made by dissolving liquid Ba(DPM)$_2$, Sr(DPM)$_2$ in an organic solvent (THF for example) so that the vapor feed and an oxygen-containing gas can be mixed and delivered to the film deposition chamber 122 and directed to a heated substrate to produce a metal oxide film thereon.

The vaporizer device 120 includes a liquid feed passage 126 communicating with an upstream feed source and a heater 124 to heat the liquid feed to a temperature higher than its vaporization temperature. On the downstream side of device 120 is a vapor feed passage 128 for discharging the vapor feed; passage 128 splits into a deposition chamber passage 129 to communicate with the reaction chamber 122 and a trap device 136a through a two-way valve 132a, and a branched bypass passage 130 to communicate with a trap device 136b through a two-way valve 132b. These two passages 129 and 130 merge again at a downstream location of the two-way valves 132c, 132d provided in respective passages to communicate with a pump 138.

The trap devices 136a, 136b are low temperature trap devices, in this case, cooled by such cooling medium as liquid nitrogen or cooled air, to capture gaseous components or the vapor feed material in a trap section. However, it is not necessary to be limited to such type of traps. Each of the traps is connected to a thermal medium supply passage 140 and a medium discharge passage 142.

The trap device 136b in the bypass passage 130 has a cleaning arrangement for removing adhering matters sticking to the interior of the trap device. To carry out such cleaning, the trap device 136b is provided with a cleaning fluid passage 144 on the entrance side and on the exit side of the trap device 136b through respective two-way valves 132e, 132f. The cleaning fluid passage 144 is comprised as a circulation path including a storage tank 148 for storing a cleaning fluid 146 primarily comprising solvent such as THF, a circulation pump 152 to deliver the cleaning fluid 146 under pressure and a filter 156 to remove solid matter from the cleaning fluid 146. At a downstream location of the filter 156, a purge gas injection passage 158 is provided through a two-way valve 132g for injecting a purge gas, such as He, into the interior space of the trap device 136b.

The cleaning fluid storage tank 148 includes a heater 150 to heat the cleaning fluid 146, a pressurizer 154 to apply a pressure on the liquid surface of the cleaning fluid 146 with a gas such as He. The pressurizer 154 pressurizes the cleaning fluid 146 to a pressure higher than the vapor pressure inside the trap device 136b so that the cleaning fluid 146 can flow into the trap device 136b in a liquid state. It is not essential to have the pressurizer, if an adequate pressure higher than the vapor pressure of the cleaning fluid 146 can be developed by using only the circulation pump 152. However, by having the pressurizer 154, it is possible to prevent partial vaporization of the cleaning fluid 146 at the intake side of the circulation pump 152 caused by a low pressure that develops thereof. It is also possible to provide a high cracking pressure check valve so that a high pressure resistant cleaning region can be made compact between the output side of the circulation pump 152 up to the pressure check valve.

The operation of the third embodiment system will be explained with reference to FIG. 3. During the film deposition process, the valves 132b, 132d in the bypass passage 130 are closed, and the valves 132a, 132c are opened in the deposition chamber passage 129 so as to deliver the vaporized vapor feed to the deposition chamber 122. When the deposition process is finished, another substrate is introduced into the deposition chamber 122 by closing the valves 132a, 132c in the deposition chamber passage 129, and opening the valves 132b, 132d in the bypass passage 130 so as to deliver the vapor feed to the bypass passage 130, and after trapping the feed gas components in the trap device 136b, the spent gas is discharged through the pump 138.

After operating the trap for some duration to accumulate a certain amount of adhering matters in the trap device 136b, the following cleaning steps are performed. First, the valves 132b, 132d in the bypass passage 130 are closed, and the cleaning fluid storage tank 148 is pressurized to a pressure higher than the vapor pressure of the cleaning fluid at the operating temperature of the trap device 136b while heating the cleaning fluid 146 to an appropriate temperature with heater 150 provided in the storage tank 148. Then, the circulation pump 152 is operated and the two-way valve 132e is opened to deliver and fill the trap device 136b with the cleaning fluid 146. At this stage, the trap device 136b is under a vacuum so that the cleaning fluid flows into the trap very quickly, and fills the trap so as to wet its inner overall surface, which enhances the cleaning effect of the following step.

Because of the vapor suppressing effect of the pressurizer 154, the cleaning fluid 146 is able to flow into the trap device 136b without turning into a vapor at the operating temperature of the trap device 136b to dissolve the adhering matters and produce effective cleaning of the trap device 136b. Also, because the cleaning fluid 146 is heated by the heater 150, both the dissolution rate of the adhering matters and the solute saturation temperature of the cleaning fluid are raised, thereby enhancing the effect of cleaning.

Next, the valve 132f in the cleaning fluid passage 144 is opened so as to circulate the cleaning fluid 146. The component substances in the vapor feed trapped in the trap device 136b are dissolved in the circulating cleaning fluid 146 and gradually increase their concentration in the storage tank 148. By choosing a solvent such as THF which has a high solubility for the feed gas components, it becomes possible to eliminate the need for enlarging the capacity of the storage tank 148 or frequently renewing the cleaning fluid 146.

When a certain amount of vapor feed is dissolved in the cleaning fluid 146, the fluid volume increases and its cleaning ability is also degraded, so that the cleaning fluid 146 needs to be exchanged. Timing for exchanging the fluid can be determined by changes in fluid parameters including the fluid volume, mass, specific gravity, light transmissivity, dielectric constant, viscosity and so on.

In this example, the cleaning fluid 146 is the same as the solvent in the feed liquid so that it can be reused after appropriate treatments to restore its purity. Such processing is also facilitated by the ability of the cleaning fluid 146 to dissolve a large amount of vapor feed so that material storage and transfer can be facilitated and the processing area does not need to be very large. Also, it is permissible to continuously supply a fresh cleaning fluid 146 into the storage tank 148 to replace spent cleaning fluid so as to maintain the cleaning capacity of the cleaning fluid.

When the cleaning process is to be terminated, the circulation pump 152 is stopped first, and then the valve 132g is opened in the purge gas injection passage 158 to admit the purge gas into the trap device 136b and to recover all the cleaning fluid 146 in the trap device 136b into the storage tank 148, and then valves 132e, 132f in the cleaning fluid passage 144 are closed. The valve 132d communicating with the exhaust pump 138 in the bypass passage 130 is closed and the exhaust pump 138 is turned on to vaporize the residual cleaning fluid in the trap device 136b to complete the cleaning process.

The above embodiment dealt with the case of cleaning the interior of the trap device 136b in the bypass passage 130; however, it is obvious that a similar cleaning fluid passage can be provided for cleaning the trap device 136a in the deposition chamber passage 129.

Figure 4:
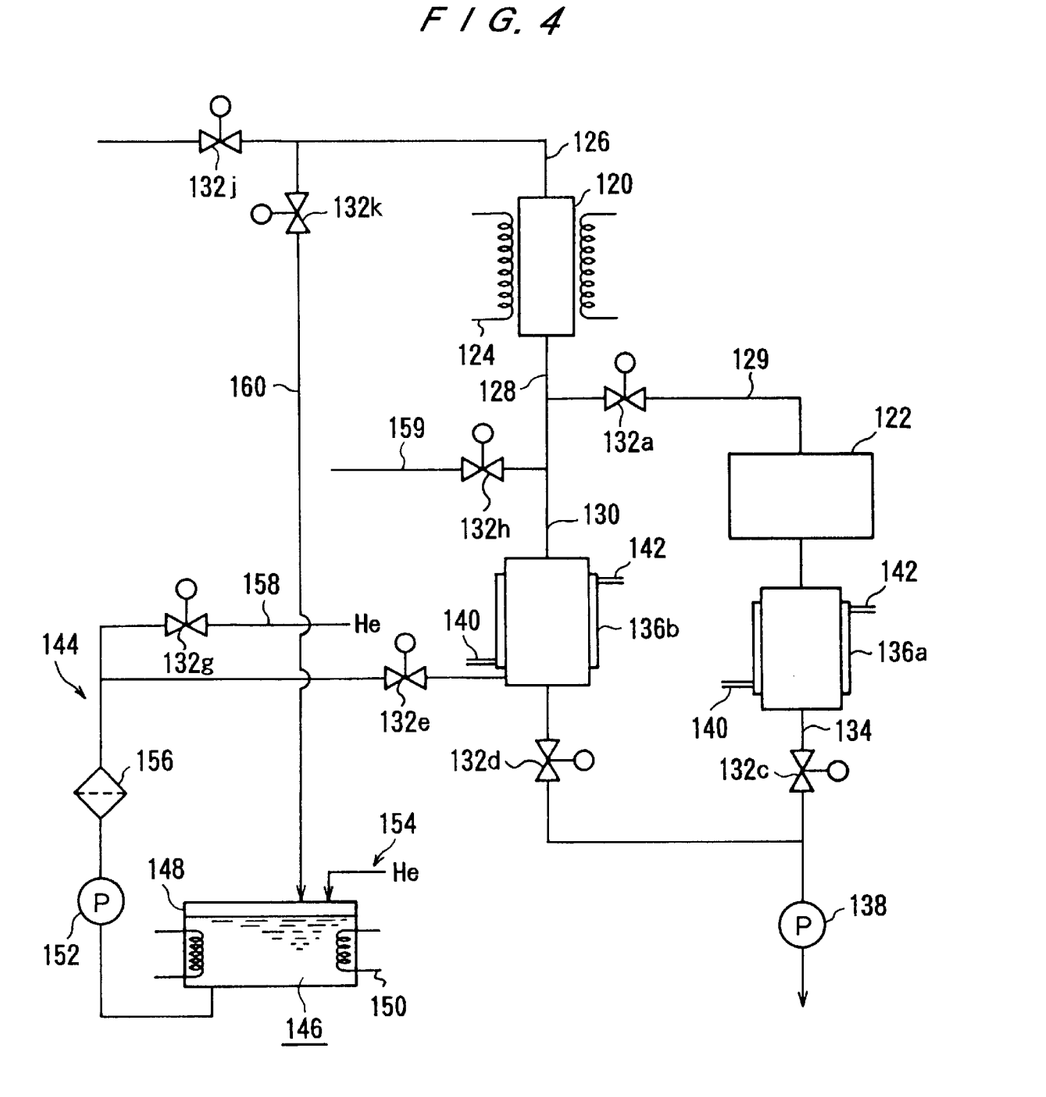
FIG. 4 is a schematic drawing of a fourth embodiment of the present invention.

FIG. 4 shows a fourth embodiment of the cleaning system. The differences between this system and the foregoing system are: first, instead of the two-way valve in the bypass passage 130 connecting the vaporizer device 120 and the trap device 136b, a two-way valve 132h is provided to connect a purge gas injection passage 159, and second, a venting passage 160 is branched from the liquid feed passage 126, at an upstream location of the vaporizer device 120, to communicate with the storage tank 148 through two-way valves 132j, 132k. In this arrangement, the cleaning fluid passage 144 makes a loop circuit starting with the storage tank 148, pump 152, through filter 156, valve 132e, exit of the trap device 136b, entry to the trap device, bypass passage 130, vapor feed passage 128, vaporizer device 120, liquid feed passage 126, valve 132k and ending in the venting passage 160 to return to the storage tank 148.

During the film deposition process, the flow of feed vapor is shut off in the bypass circuit 130 by closing the valve 132d and opening the valves 132a, 132c in the deposition chamber passage 129. The valve 132h is opened to inject a minute amount of carrier gas such as Ar into the passage between the vaporizer and the trap device 136b through the gas injection passage 159. In this arrangement, a majority of the vapor feed flows towards the deposition chamber passage 129 during the film deposition process so that the carrier gas prevents a part of the vapor feed from flowing into the trap device 136b.

Such a system allows switching of the gas flow path by removing a two-way valve, which is susceptible to precipitation of unvaporized or degraded matters, in the passage that carries gases containing such matters. Therefore, problems related to harmful effects of such precipitate particles on the valve element and valve seats are eliminated to assure reliable operation of the bypass passage.

During a period of stabilization of the vaporizer device 120 or when the deposition process has been completed, the system can be shut down in the same manner by closing the valves 132a, 132c in the deposition chamber passage 129 and also closing the valve 132h in the gas injection passage 159, and opening the valve 132d in the bypass passage 130 to carry out a trapping operation in the trap device 136b. For cleaning the trap device 136b, the valve 132d in the bypass passage 130 is closed and the valve 132e in the cleaning fluid passage 144 is opened to let the cleaning fluid 146 flow successively through the storage tank 148, pump 152, filter 156, valve 132e, exit of the trap device 136b, entry to the trap device, bypass passage 130, vapor feed passage 128, vaporizer device 120, liquid feed passage 126, valve 132k and the venting passage 160. Accordingly, it becomes possible to clean both the trap device 136b and the vaporizer device 120 at the same time.

Figure 5:
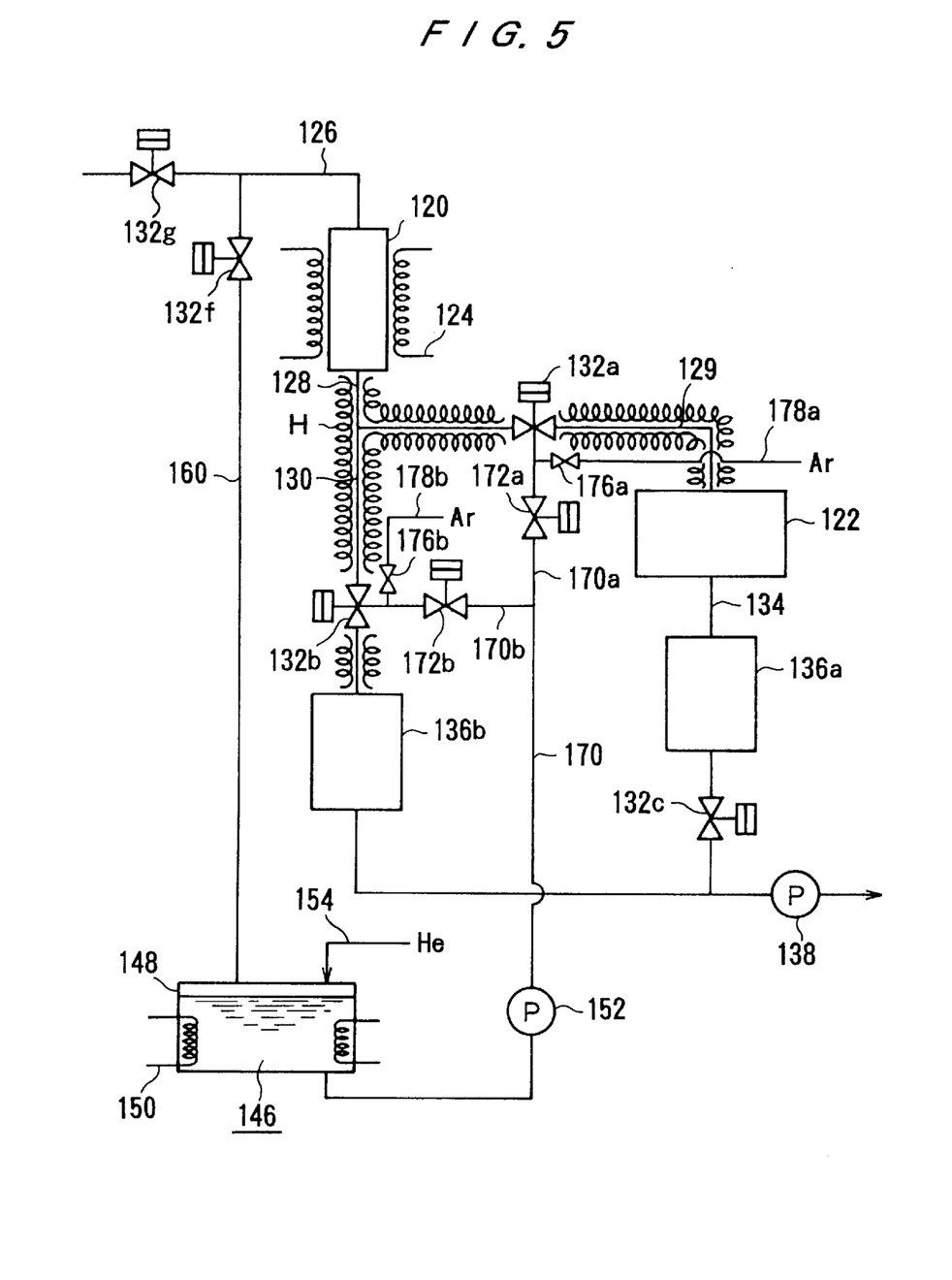
FIG. 5 is a schematic drawing of a fifth embodiment of the present invention.
Figure 6:
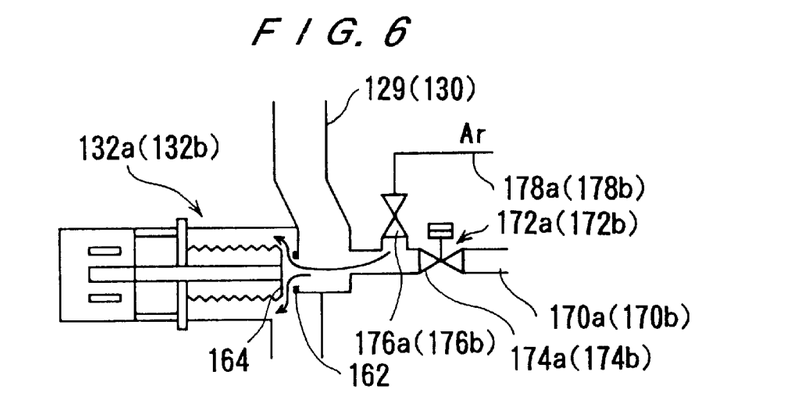
FIG. 6 is an enlarged schematic cross sectional view of key parts in a cleaning step.
Figure 7:
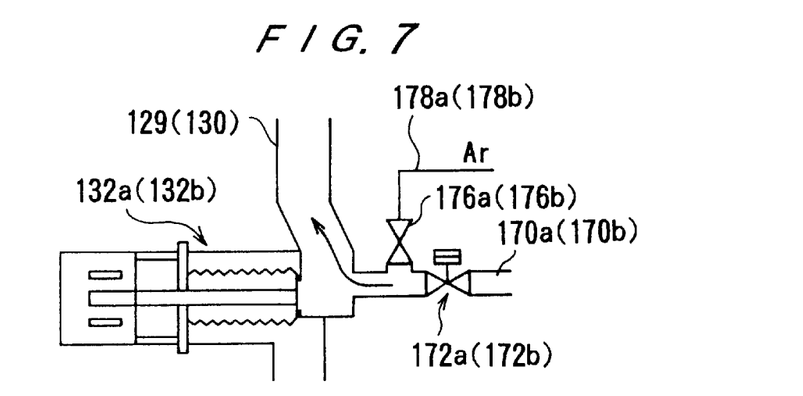
FIG. 7 is an enlarged schematic cross sectional view of key parts in a cleaning step.

FIGS. 5 shows a fifth embodiment of the vapor feed supply system. The systems shown in FIGS. 5 to 7 are basically the same as the foregoing systems, but the difference is that the two-way valves 132a, 132b, for switching the feed gas passage 128 between the deposition chamber passage 129 and the bypass passage 130, serve to facilitate the cleaning process. Also, a heater H is provided to maintain the vapor feed at a constant temperature in the feed gas passage 128, deposition chamber passage 129, bypass passage 130 and the vicinity of the associated valves.

Specifically, the valve 132a in the deposition chamber passage 129 and the valve 132b in the bypass passage 130 are connected to cleaning fluid supply passage 170 extending from the storage tank 148 through a pump 152. The cleaning fluid supply passage 170 splits into two branched passages 170a, 170b at a downstream location of the pump 152, and each of the branched passages 170a, 170b is connected through the valves 172a, 172b to respective cleaning fluid ports 174a, 174b provided on the input side of the valves 132a, 132b. The valves 132a, 132a have respective gas injection ports 176a, 176b, in the vicinity of the cleaning fluid ports 174a, 174b which are connected to purge gas passages 178a, 178b connected to a purge gas source containing a purge gas such as Ar.

Also, a venting passage 160 is provided close to an upstream location of the vaporizer device 120 to connect the liquid feed passage 126 with the cleaning fluid storage tank 148. The venting passage 160 has a two-way valve 132f and an upstream side of the branching point in the feed supply passage 126 has a two-way valve 132g.

The operation of the cleaning system will be explained with reference to FIG. 5. For carrying out a film deposition process, the valve 132a in the deposition chamber passage 129 is opened, and the valve 132b in the bypass passage 130 is closed to deliver the vapor feed into the deposition chamber 122. When a deposition process is not being carried out or during the vapor stabilization period, the valve 132a in the deposition chamber passage 129 is closed and the valve 132b in the bypass passage 130 is opened to lead the vapor feed into the bypass passage 130. The spent gas discharged from the deposition chamber 122 through the exhaust gas passage 134 and the trap device 136a are merged with the vapor feed flowing through the trap device 136b in the bypass passage 130 and discharged from the exhaust pump 138.

The vapor feed flows through the valves 132a, 132b and unvaporized matters in the vapor feed and reaction byproducts are precipitated onto valve seats 162 and valve elements 164. Therefore, the following steps are taken to prevent the adhesion of such matters and cleaning of adhering matters.

First, immediately before closing the valves 132a, 132b, the valves 172a, 172b in the branched passages 170a, 170b are closed, and as shown in FIG. 6, the ports 176a, 176b are opened to allow heated purge gas such as Ar or cleaning fluid to be injected to remove adhering matters from the valve seats 162 and valve elements 164 in the valves 132a, 132b. After these steps, the adhered matters are removed from the valve seats 162 and the valve elements 164 so that hermetic sealing of the valves 132a, 132b will not be deteriorated when the valves are closed.

Next, the ports 176a, 176b are closed, and the pump 152 is operated and, simultaneously, the valves 172a, 172b in the branched passages 170a, 170b and the cleaning fluid ports 174a, 174b are opened. As shown in FIG. 7, this prompts the pressurized cleaning fluid 146 to flow into the input side of the valves 132a, 132b through the pump 152 and the pressurizer 154. The cleaning fluid 146 is circulated from the vaporizer device 120 into the cleaning fluid venting passage 160 by opening the valve 132f in the cleaning fluid venting passage 160. Because the cleaning fluid 146 is pressurized to prevent vaporizing, it flows from the valves 132a, 132b into the vaporizer device 120 in a liquid state, and efficiently dissolves and cleans the adhering matters therein. Because the cleaning fluid 146 is heated by the heater 150 in the storage tank 148, both the dissolution rate of the adhering matters and the solubility of the cleaning fluid are raised, thereby enhancing the cleaning process.

After stopping the pump 152, the valves 172a, 172b in the branched passages 170a, 170b are closed, then the gas injection ports 176a, 176b are opened to introduce a purge gas into gas injection passages 178a, 178b, thereby recovering all the cleaning fluid from the vaporizer device 120 through the valves 132a, 132b into the storage tank 148 to complete the cleaning process. The cleaning process is applied to the vaporizer device 120, and all the passages including feed gas supply passage 126 and bypass passage 130, as well as the valve seats 162 and the valve discs (valve elements) 164 in the valves 132a, 132b.

When a certain amount of vapor feed is dissolved in the cleaning fluid after repeating several cleaning processes, the fluid volume increases and its cleaning ability is diminished, and the cleaning fluid needs to be replaced. Timing for replacing the spent cleaning fluid is determined from changes in parameters including the fluid volume, mass, specific gravity, light transmissivity, dielectric constant and viscosity and so on.

Figure 8:
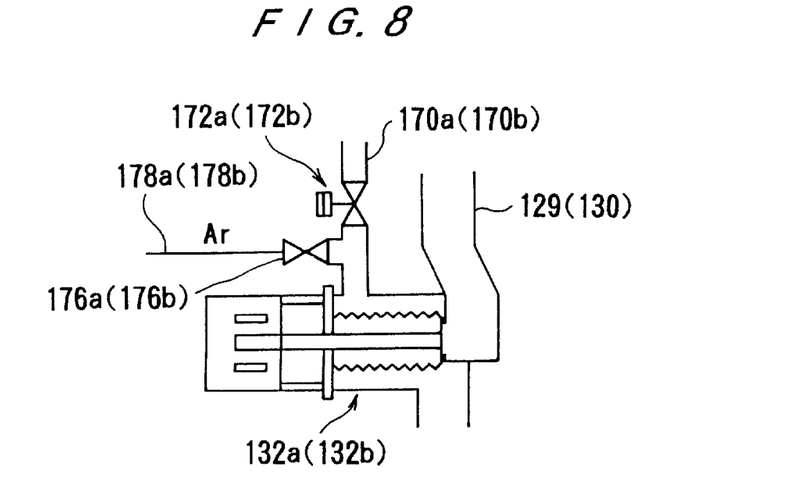
FIG. 8 is an enlarged schematic cross sectional view of key parts in a two-way valve in another embodiment.

In the above embodiment, the cleaning fluid is introduced to the inlet side of the two-way valve, but as shown in FIG. 8, it is allowable to introduce the cleaning fluid at the outlet side of the two-way valve, as necessary.

Applications of the trap devices 136a, 136b shown in FIGS. 3 to 5 for use with the vapor feed supply system of the present invention will be explained with reference to FIGS. 9 to 12. In the following presentation, the structures of the cleaning fluid passages have been omitted.

Figure 9:
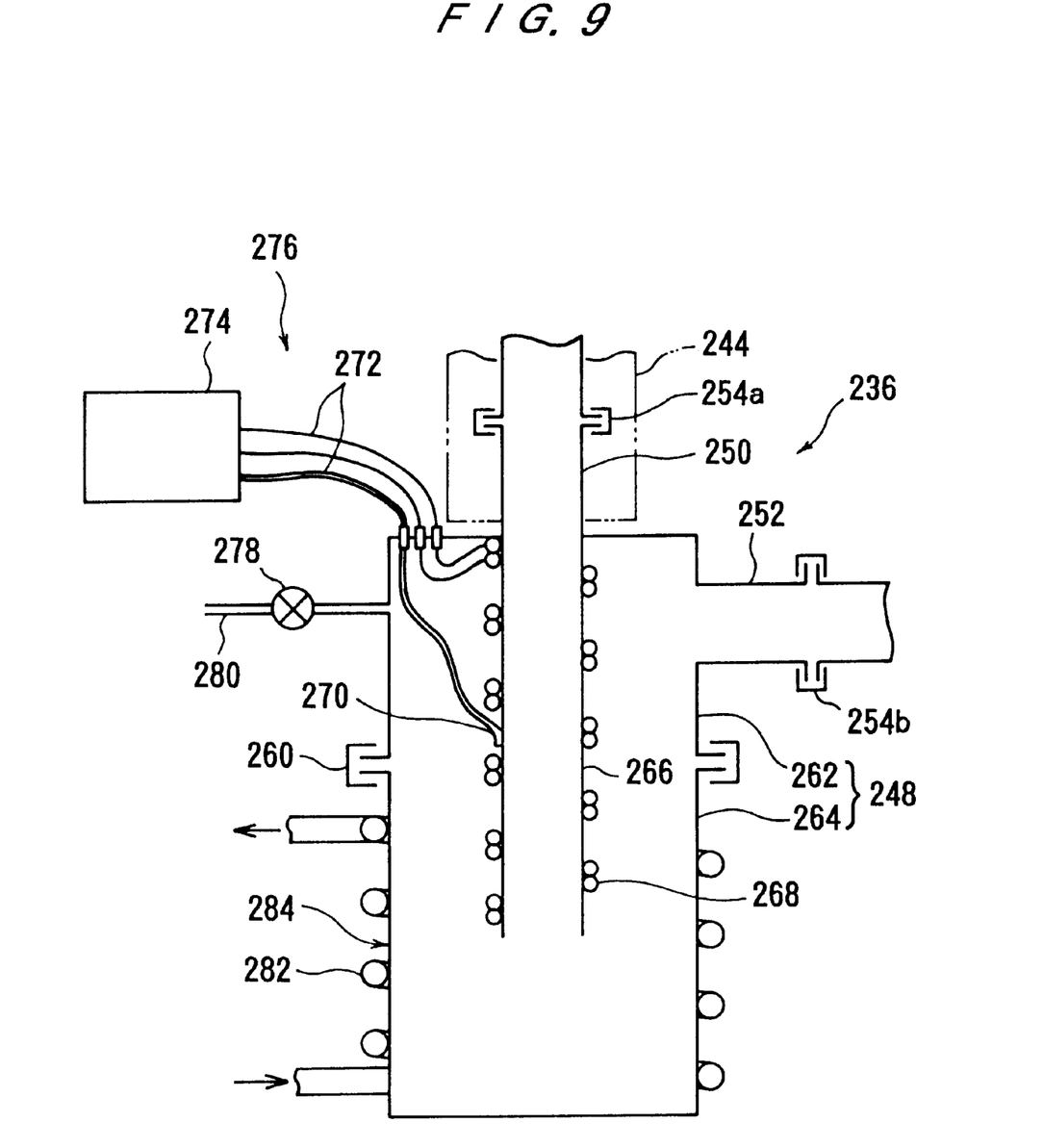
FIG. 9 is a schematic view of an embodiment of a trap device.

The trap device 236 shown in FIG. 9 comprises a roughly cylindrical trap vessel 248 and an inlet pipe 250 connected to its top end and an outlet pipe 252 disposed in the upper region of the trap vessel 248. The inner end of the inlet pipe 250 extends into the interior of the trap vessel 248 and constitutes an inner pipe 266 having its opening below a longitudinal midpoint of the vessel 248. Thus, a feed gas passage is formed which starts from the inlet pipe 250 and descends through the inner tube 266, reverses its direction at the bottom of the trap vessel 248 and reaches the outlet pipe 252.

The trap vessel 248 is comprised by an upper vessel 262 and a lower vessel 264 joined together by a quick coupling 260. The upper vessel 263 is connected to a leak pipe 280 having a leak valve 278. The inlet pipe 250 and the outlet pipe 252 are connected to the bypass passage 130 and others through quick couplings 254a, 254b. These quick couplings 260, 254a, 254b are easily detachable by simple maneuvers, and maintain a certain degree of hermetic sealing.

A sheath heater 268 is wound on the inner pipe 266 of the inlet pipe 250, and a temperature sensor 270 is disposed in a suitable location. Lead wires 272 are connected to a controller 274, which controls the current supply to the sheath heater 268 according to output signals of the temperature sensor 270. A temperature controller 276 is thus formed to maintain the inner pipe 266 of the inlet pipe 250 at a selected temperature to prevent condensation and/or decomposition of the vapor feed on the inner pipe 266.

On the other hand, the lower vessel 264 has a cooling pipe 282 flowing a cooling medium wound on its outer surface to comprise a cooling section 284 to cool the inner walls to a temperature lower than the vaporization temperature. The gases entering through the inlet pipe 250 into the trap vessel 248 condense and accumulate on the inner wall surface of the lower vessel 264 which is cooled by the cooling pipe 282.

As shown in FIG. 9, the trap device is constructed in such a way that the gaseous components are delivered to the interior of the trap vessel 248 without being cooled anywhere, by providing the piping to join the vaporizer device and the trap device 248 with a temperature controller 244 such as a mantle heater, and heating the inner pipe 266 of the inlet pipe 250 extending into the interior of the trap vessel 248 with a temperature controller 276.

The gaseous components led to the trap vessel 248 do not condense on the inner pipe 266, and descend further into the lower vessel 264 and contact the cooling section 284 of the lower vessel 264 to condense thereon. The remainder of the gaseous components such as carrier gas, after having lost their condensable portion, are exhausted through the outlet pipe 252 disposed in the top section of the trap vessel 248. Although the trap vessel 248 may be reused by applying the cleaning method described in the foregoing embodiments, it is also possible to replace the lower vessel 264 having the condensed feed material with a fresh and clean one by decoupling the quick coupling 260.

In this arrangement, the gas passage is constructed such that after entering through the inlet pipe 250 and descending down the inner pipe 266, the gas stream reverses its direction at the bottom of the trap vessel 248 which forms a cooling section 284. This trap design provides a cooling section 284 of a relatively high volume capacity to enable accumulation of a sufficient volume of condensates for economic processing. The inner pipe 266 delivering the gaseous components is controlled above the condensation temperature so that no blockage is generated by condensed matters. Easy exchange of the trap vessel 248 due to the quick coupling 260 provides minimal disruptions to the operation and a simple method for cleaning the lower vessel 264. The condensates collected in the lower vessel 264 can be regenerated by a suitable method and reused.

Figure 10:
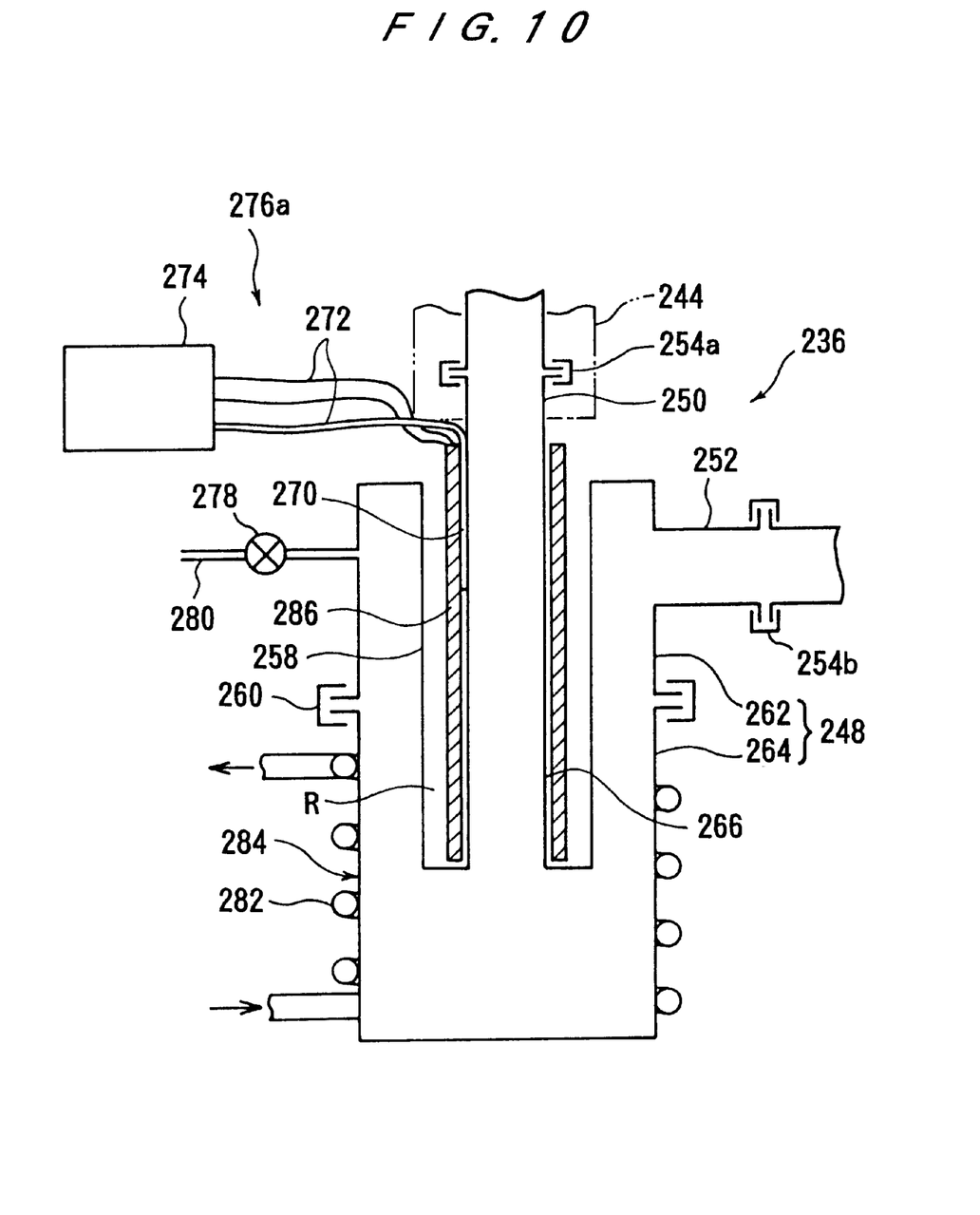
FIG. 10 is a schematic drawing of another embodiment of a trap device.

FIG. 10 shows another type of trap device. The difference between this arrangement and the arrangement shown in FIG. 9 is that a second pipe 258 is provided to surround the inner pipe 266 so as to form a cylindrical space R which opens to the external environment. The cylindrical space R has a temperature controller 276a comprised by a sheet heater 286 to surround the inner pipe 266 and a temperature sensor 270. This design avoids any condensates from forming on the heater 286 and the temperature sensor 270 so that time-dependent deterioration of temperature control ability is avoided, as well as to facilitate maintenance of the trap device.

Figure 11:
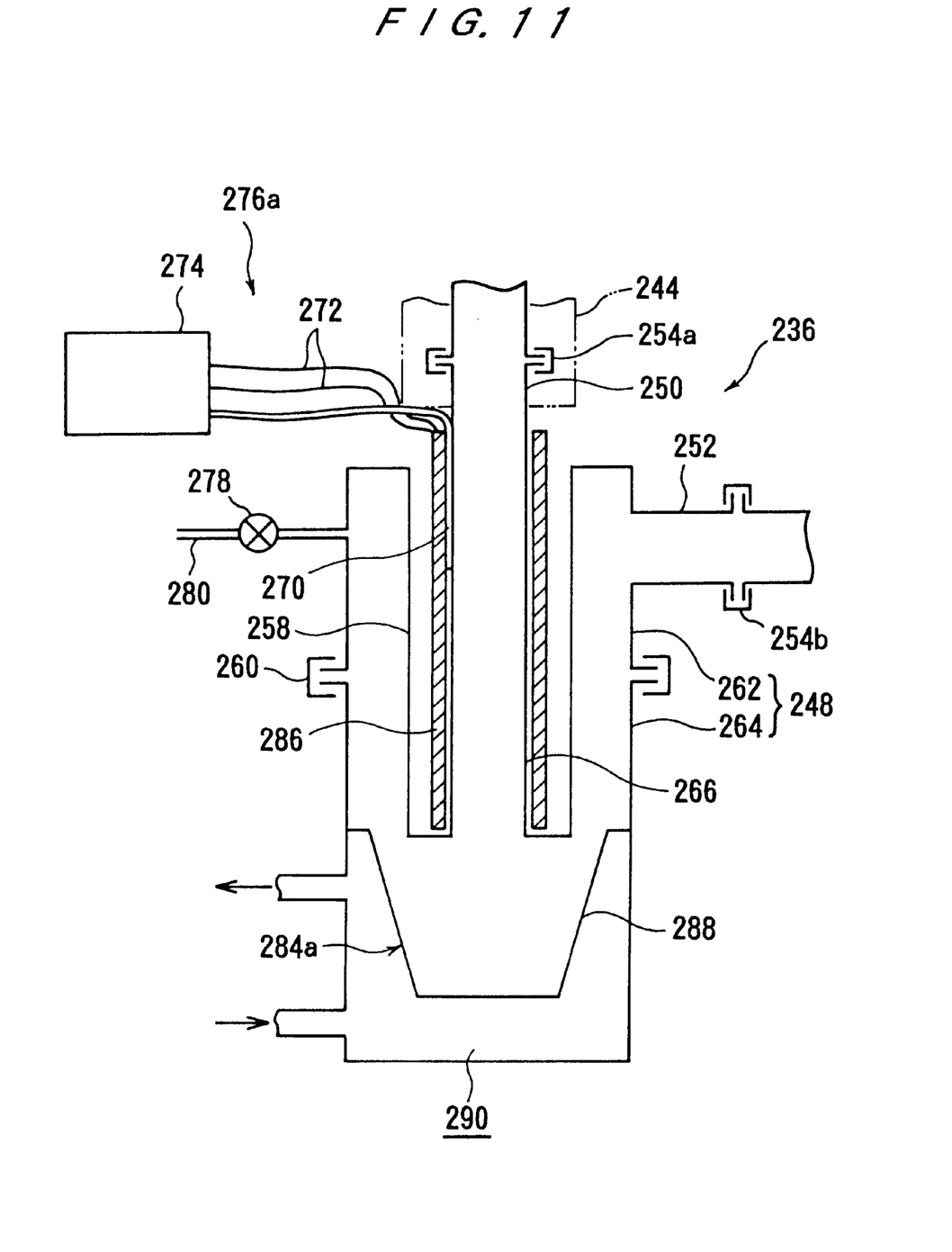
FIG. 11 is a schematic drawing of still another embodiment of a trap device.

FIG. 11 shows still another type of trap device. The difference between this arrangement and the second arrangement shown in FIG. 10 is that a cooling section 284a is constructed by providing a cooling jacket 290 formed by a partition wall 288 on the inside of the lower vessel 264. By flowing a suitable cooling medium through the cooling jacket 290, cooling efficiency of the cooling section 284a is increased to enhance the trapping efficiency.

Figure 12:
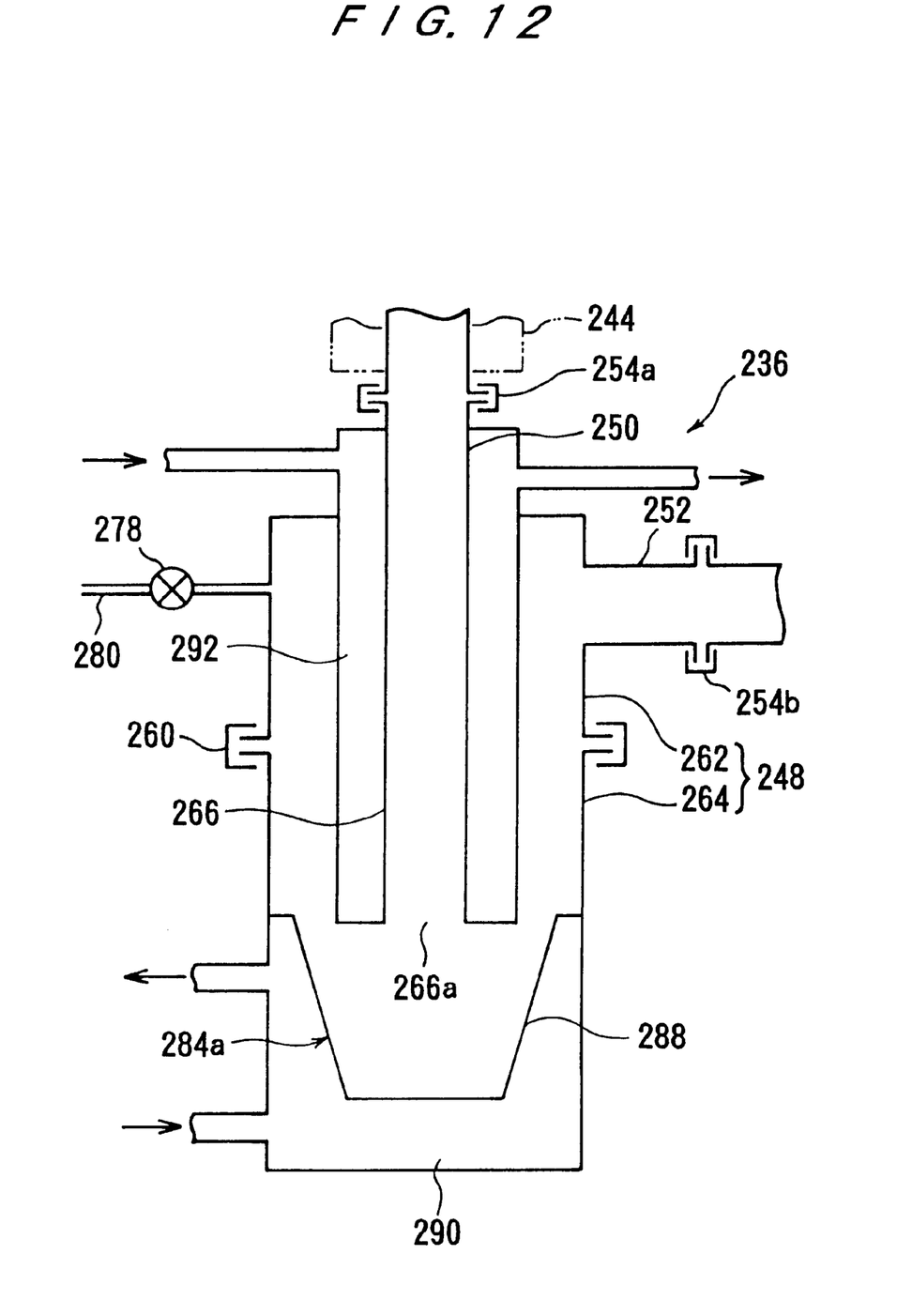
FIG. 12 is a schematic drawing of yet another embodiment of a trap device.

FIG. 12 shows still another type of trap device. The difference between this arrangement and the third arrangement shown in FIG. 11 is that is that a jacket heater 292 is provided surrounding the inner pipe 266 of the inlet pipe 250. This design promotes temperature uniformity of the inner pipe 266 of the inlet pipe 250.

What is claimed is:

1. A vaporizer apparatus comprising:
    a vaporizer device for vaporizing a liquid feed supplied through a liquid feed passage under a specific pressure and a specific temperature to form a vapor feed and delivering the vapor feed to a vapor feed passage, said vaporizer device including a thermal medium passage for selectively flowing therethrough a heating medium and a cooling medium;
    a cleaning fluid supply device for delivering a cleaning fluid to a cleaning region including at least a portion of said vaporizer device;
    a pressurizer for pressuring the cleaning fluid flowing into said cleaning region; and
    a cooling device for cooling the cleaning fluid.

2. A vaporizer apparatus according to claim 1, wherein said pressurizer is capable of pressurizing the cleaning fluid to a pressure not lower than a vaporization pressure thereof at a cleaning temperature.

3. A vaporizer apparatus according to claim 1, wherein said cleaning fluid supply device includes a cleaning fluid passage to merge with said vapor feed passage and to branch off from said vapor feed passage.

4. A vaporizer apparatus according to claim 3, wherein said cleaning fluid passage is provided with a heating device for heating the cleaning fluid.

5. A vaporizer apparatus comprising:
    a vaporizer device for vaporizing a liquid feed supplied through a liquid feed passage under a specific pressure and a specific temperature to form a vapor feed and delivering the vapor feed to a vapor feed passage;
    a cleaning fluid supply device for delivering a cleaning fluid to a cleaning region including at least a portion of said vaporizer device;
    a pressurizer for pressurizing the cleaning fluid flowing into said cleaning region; and
    a valve device for controlling opening of said vapor feed passage, said valve device comprising a purge gas supply port for directing a purge gas to spaces between a valve element and a valve seat.

6. A vaporizer apparatus according to claim 5, wherein said pressurizer is capable of pressurizing the cleaning fluid to a pressure not lower than a vaporization pressure thereof at a cleaning temperature.

7. A vaporizer apparatus according to claim 5, wherein said cleaning fluid supply device includes a cleaning fluid passage to merge with said vapor feed passage and to branch off from said vapor feed passage.

8. A vaporizer apparatus according to claim 7, wherein said cleaning fluid passage is provided with a heating device for heating the cleaning fluid.

9. A vaporizer apparatus according to claim 5, further comprising a cooling device for cooling the cleaning fluid.

10. A vaporizer apparatus according to claim 5, wherein said vaporizer device is provided with a thermal medium passage for selectively flowing therethrough a heating medium and a cooling medium.

11. A vaporizer apparatus comprising:
    a vaporizer device for vaporizing a liquid feed supplied through a liquid feed passage under a specific pressure and a specific temperature to form a vapor feed and delivering the vapor feed to a vapor feed passage;
    a cleaning fluid supply device for delivering a cleaning fluid to a cleaning region including at least a portion of said vaporizer device;
    a pressurizer for pressuring the cleaning fluid flowing into said cleaning region; and
    a valve device for controlling opening of said vapor feed passage, said valve device comprising a cleaning fluid supply port for directing a cleaning fluid from a vicinity of a valve element to at least one passage of either an upstream passage or a downstream passage of said vapor feed passage.

12. A vaporizer apparatus according to claim 11, wherein said pressurizer is capable of pressurizing the cleaning fluid to a pressure not lower than a vaporization pressure thereof at a cleaning temperature.

13. A vaporizer apparatus according to claim 11, wherein said cleaning fluid supply device includes a cleaning fluid passage to merge with said vapor feed passage and to branch off from said vapor feed passage.

14. A vaporizer apparatus according to claim 13, wherein said cleaning fluid passage is provided with a heating device for heating the cleaning fluid.

15. A vaporizer apparatus according to claim 11, further comprising a cooling device for cooling the cleaning fluid.

16. A vaporizer apparatus according to claim 11, wherein said vaporizer device is provided with a thermal medium passage for selectively flowing therethrough a heating medium and a cooling medium.

17. A vaporizer apparatus comprising:

a liquid feed passage for supplying a liquid feed;

a vaporizer device for receiving the liquid feed from said liquid feed passage, said vaporizer device having a vaporization passage for vaporizing the thus received liquid feed to form a vapor feed, and a heating member for heating said vaporization passage;

a vapor feed passage for flow therethrough of the vapor feed;

a cleaning fluid supply device for delivering a cleaning fluid to a cleaning region including at least a portion of said vaporization passage;

a pressurizer for pressurizing the cleaning fluid flowing into said cleaning region to a cleaning pressure; and said cleaning region having a construction to withstand said cleaning pressure.

18. An apparatus as claimed in claim 17, wherein said cleaning region includes a portion of said liquid feed passage, said vaporization passage, and a portion of said vapor feed passage.

19. An apparatus as claimed in claim 17, further comprising valve devices in said liquid feed passage and said vapor feed passage, said valve devices delimiting said cleaning region.

20. An apparatus as claimed in claim 17, wherein said pressurizer is capable of pressurizing the cleaning fluid to a pressure not less than a vaporization temperature thereof at a cleaning temperature.

21. An apparatus as claimed in claim 17, wherein said pressurizer is capable of pressurizing the cleaning fluid to a pressure whereat the cleaning fluid undergoes partial vaporization at a cleaning temperature.

22. An apparatus as claimed in claim 17, wherein said pressurizer comprises a pump.

23. An apparatus as claimed in claim 17, wherein said pressurizer comprises an accumulator.

24. An apparatus as claimed in claim 17, wherein said cleaning fluid supply device includes a cleaning fluid passage merging with said vapor feed passage and to branch off from said vapor feed passage.

25. An apparatus as claimed in claim 24, wherein said cleaning fluid passage includes a cleaning fluid supply tank.

26. An apparatus as claimed in claim 25, further comprising a heater for heating said cleaning fluid supply tank.

27. An apparatus as claimed in claim 24, wherein said cleaning fluid passage includes a heating device for heating the cleaning fluid.

28. An apparatus as claimed in claim 17, further comprising a cooling device for cooling the cleaning fluid.

29. An apparatus as claimed in claim 17, wherein said vaporizer device is provided with a thermal medium passage for selectively flowing therethrough a heating medium and a cooling medium.

30. A vaporizer apparatus comprising:

a vaporizer device for converting a liquid feed supplied through a liquid feed passage to a vapor feed at a vaporizing pressure and a vaporizing temperature and for delivering the vapor feed to a vapor feed passage;

a valve device for opening or closing said vapor feed passage, said valve device including a valve element and a valve seat;

a cleaning fluid storage tank;

a cleaning fluid supply port connected to said cleaning fluid storage tank for directing cleaning fluid from a vicinity of said valve element to flow to an upstream side of said vapor feed passage;

a cleaning fluid venting passage communicating switchably with said cleaning fluid storage tank and said liquid feed passage; and a purge gas supply port for directing a purge gas to a space between said valve element and said valve seat of said valve device.

31. A vaporizer apparatus comprising:

a vaporizer device for converting a liquid feed supplied through a liquid feed passage to a vapor feed at a vaporizing pressure and a vaporizing temperature and for delivering the vapor feed to a vapor feed passage;

a valve device for opening or closing said vapor feed passage, said valve device including a valve element and a valve seat;

a cleaning fluid storage tank;

a cleaning fluid supply port connected to said cleaning fluid storage tank for directing cleaning fluid from a vicinity of said valve element to at least one passage of either an upstream passage or a downstream passage of said vapor feed passage; and a cleaning fluid venting passage communicating switchably with said cleaning fluid storage tank and said liquid feed passage.

* * * * *